US007964865B2

(12) United States Patent
Chidambarrao et al.

(10) Patent No.: US 7,964,865 B2
(45) Date of Patent: Jun. 21, 2011

(54) STRAINED SILICON ON RELAXED SIGE FILM WITH UNIFORM MISFIT DISLOCATION DENSITY

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1168 days.

(21) Appl. No.: 11/048,739

(22) Filed: Feb. 3, 2005

(65) Prior Publication Data

US 2005/0164477 A1    Jul. 28, 2005

Related U.S. Application Data

(62) Division of application No. 10/667,603, filed on Sep. 23, 2003, now Pat. No. 6,872,641.

(51) Int. Cl.
*H01L 29/06* (2006.01)
(52) U.S. Cl. .................. 257/19; 257/E29.193; 438/478
(58) Field of Classification Search .................. 257/18, 257/19, E21.123, E29.298, E29.193; 438/478
See application file for complete search history.

(56) References Cited

U.S. PATENT DOCUMENTS

| | | | |
|---|---|---|---|
| 3,602,841 A | | 8/1971 | McGroddy |
| 4,665,415 A | | 5/1987 | Esaki et al. |
| 4,853,076 A | | 8/1989 | Tsaur et al. |
| 4,855,245 A | | 8/1989 | Neppl et al. |
| 4,860,067 A | * | 8/1989 | Jackson et al. ............... 257/190 |
| 4,952,524 A | | 8/1990 | Lee et al. |
| 4,958,213 A | | 9/1990 | Eklund et al. |
| 5,006,913 A | | 4/1991 | Sugahara et al. |
| 5,060,030 A | | 10/1991 | Hoke |
| 5,081,513 A | | 1/1992 | Jackson et al. |
| 5,097,308 A | * | 3/1992 | Salih ............................. 257/578 |
| 5,102,810 A | * | 4/1992 | Salih ............................. 438/310 |
| 5,108,843 A | | 4/1992 | Ohtaka et al. |
| 5,134,085 A | | 7/1992 | Gilgen et al. |
| 5,310,446 A | | 5/1994 | Konishi et al. |

(Continued)

FOREIGN PATENT DOCUMENTS

JP          64-76755          3/1989

(Continued)

OTHER PUBLICATIONS

Watson et al., "Controlled misfit dislocation nucleation in Si0.90Ge0.10 epitaxial layers grown on Si", Applied Physics Letters, Aug. 9, 1993, vol. 63, Issue 6, pp. 746-748.*

(Continued)

*Primary Examiner* — Thao X Le
*Assistant Examiner* — William F Kraig
(74) *Attorney, Agent, or Firm* — Joseph P. Abate; Roberts Mlotkowski Safran & Cole, P.C.

(57) ABSTRACT

A method for forming a semiconductor substrate structure is provided. A compressively strained SiGe layer is formed on a silicon substrate. Atoms are ion-implanted onto the SiGe layer to cause end-of-range damage. Annealing is performed to relax the strained SiGe layer. During the annealing, interstitial dislocation loops are formed as uniformly distributed in the SiGe layer. The interstitial dislocation loops provide a basis for nucleation of misfit dislocations between the SiGe layer and the silicon substrate. Since the interstitial dislocation loops are distributed uniformly, the misfit locations are also distributed uniformly, thereby relaxing the SiGe layer. A tensilely strained silicon layer is formed on the relaxed SiGe layer.

6 Claims, 2 Drawing Sheets

U.S. PATENT DOCUMENTS

| | | | |
|---|---|---|---|
| 5,354,695 A | 10/1994 | Leedy | |
| 5,371,399 A | 12/1994 | Burroughes et al. | |
| 5,391,510 A | 2/1995 | Hsu et al. | |
| 5,395,770 A * | 3/1995 | Miki et al. | 117/94 |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,888,885 A * | 3/1999 | Xie | 438/493 |
| 5,940,736 A | 8/1999 | Brady et al. | |
| 5,946,559 A | 8/1999 | Leedy | |
| 5,989,978 A | 11/1999 | Peidous | |
| 6,008,126 A | 12/1999 | Leedy | |
| 6,025,280 A | 2/2000 | Brady et al. | |
| 6,039,803 A * | 3/2000 | Fitzgerald et al. | 117/89 |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,274,444 B1 | 8/2001 | Wang | |
| 6,281,532 B1 | 8/2001 | Doyle et al. | |
| 6,284,626 B1 | 9/2001 | Kim | |
| 6,313,016 B1 * | 11/2001 | Kibbel et al. | 438/478 |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,975 B1 | 6/2002 | Brunner et al. | |
| 6,406,973 B1 | 6/2002 | Lee | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,583,015 B2 * | 6/2003 | Fitzgerald et al. | 438/287 |
| 6,593,191 B2 * | 7/2003 | Fitzgerald | 438/282 |
| 6,717,216 B1 | 4/2004 | Doris et al. | |
| 6,734,527 B1 * | 5/2004 | Xiang | 257/616 |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 7,049,627 B2 * | 5/2006 | Vineis et al. | 257/18 |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0107032 A1* | 6/2003 | Yoshida | 257/19 |
| 2003/0143783 A1* | 7/2003 | Maa et al. | 438/149 |
| 2004/0031979 A1* | 2/2004 | Lochtefeld et al. | 257/233 |
| 2004/0040493 A1* | 3/2004 | Vineis et al. | 117/89 |
| 2004/0150006 A1* | 8/2004 | Aulnette et al. | 257/200 |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0014366 A1* | 1/2006 | Currie | 438/517 |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2007/0020874 A1* | 1/2007 | Xie et al. | 438/423 |

FOREIGN PATENT DOCUMENTS

| | | |
|---|---|---|
| JP | 2003-128494 | 8/2003 |

OTHER PUBLICATIONS

Samavedam et al., "Relaxation of strained Si layers grown on SiGe buffers", Journal of Vacuum Science & Technology B: Microelectronics and Nanometer Structures—Jul. 1999—vol. 17, Issue 4, pp. 1424-1429.*

Buca et al., "The Use of Ion Implantation and Annealing for the Fabrication of Strained Silicon on thin SiGe Virtual Substrates", Mat. Res. Soc. Symp. Proc. vol. 809, Spring 2004—No Month cited.*

Luysberg et al. "Effect of helium ion implantation and annealing on the relaxation behavior of pseudomorphic Si1-xGex buffer layers on Si (100) substrates" J. Appl. Phys., vol. 92, No. 8, pp. 4290-4295.*

Mantl et al., "Strain Relaxation of epitaxial SiGe layers pm Si(100) improved by hydrogen implantation", Nucl. Inst. Meth. Phys. Res. B 147 (1999) 29-34.*

Kern Rim, et al, "Transconductance Enhancement in Deep Submicron Strained-Si $n$-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

STRAINED SILICON ON RELAXED SIGE FILM WITH UNIFORM MISFIT DISLOCATION DENSITY

CROSS REFERENCE TO RELATED APPLICATION

This application is a divisional application of U.S. application Ser. No. 10/667,603, filed on Sep. 23, 2003, now U.S. Pat. No. 6,872,641 which is now incorporated herein by reference in its entirety.

BACKGROUND OF THE INVENTION

1. Field of the Invention

The invention relates to methods for manufacturing semiconductor devices having improved device performances, and, more particularly to methods for forming a relaxed SiGe film.

2. Background Description

The escalating requirements for ultra large scale integration semiconductor devices require ever increasing high performance and density of transistors. With device scaling-down reaching limits, the trend has been to seek new materials and methods that enhance device performance. One of the most direct methods to increase performance is through mobility enhancement. It has been known that stress or strain applied to semiconductor lattice structures can improve device performances. For example, an N type device formed on an biaxially strained (e.g., an expanded lattice) silicon substrate exhibits better device performances than other N type devices formed on a silicon substrate without strain (or the expanded lattice structure). Also, a P type device having longitudinal (in the direction of current flow) compressive strain exhibits better device performance than other P type devices formed on a silicon substrate without such strain. The P type device also exhibits enhanced performance with very large biaxial tensile strain.

Alternatively, it has been known that a device exhibits better performance characteristics when formed on a silicon layer (or cap) that is epitaxially grown on another epitaxially grown SiGe layer that has relaxed on top of the silicon substrate. In this system, the silicon cap experiences biaxial tensile strain. When epitaxially grown on silicon, an unrelaxed SiGe layer will have a lattice constant that conforms to that of the silicon substrate. Upon relaxation (through a high temperature process for example) the SiGe lattice constant approaches that of its intrinsic lattice constant which is larger than that of silicon. A fully relaxed SiGe layer has a lattice constant close to that of its intrinsic value. When the silicon layer is epitaxially grown thereon, the silicon layer conforms to the larger lattice constant of the relaxed SiGe layer and this applies physical biaxial stress (e.g., expansion) to the silicon layer being formed thereon. This physical stress applied to the silicon layer is beneficial to the devices (e.g., CMOS devices) formed thereon because the expanded silicon layer increases N type device performance and higher Ge concentration in the SiGe layer improves P type device performances.

Relaxation in SiGe on silicon substrates occurs through the formation of misfit dislocations. For a perfectly relaxed substrate, one can envision a grid of misfit dislocations equally spaced that relieve the stress. The misfit dislocations facilitate the lattice constant in the SiGe layer to seek its intrinsic value by providing extra half-planes of silicon in the substrate. The mismatch strain across the SiGe/silicon interface is then accommodated and the SiGe lattice constant is allowed to get larger.

However, the problem with this conventional approach is that it requires a multi-layered SiGe buffer layer that is very thick (e.g., a thickness of approximately 5000 Å to 15000 Å) to achieve misfit dislocations on its surface portion while avoiding threading dislocations between the SiGe layer and the silicon substrate layer, thereby achieving a relaxed SiGe structure on the surface of the multi-layered SiGe layer. Also, this approach significantly increases manufacturing time and costs. Further, the thick graded SiGe buffer layer cannot be easily applied to silicon-on-insulator (SOI). This is because for silicon-on-insulator the silicon thickness has to be below 1500 Å for the benefits of SOI to be valid. The SiGe buffer layer structure is too thick.

Another problem is that misfit dislocations formed between the SiGe layer and the silicon epitaxial layer are random and highly non-uniform and cannot be easily controlled due to heterogeneous nucleation that cannot be easily controlled. Also, misfit dislocation densities are significantly different from one place to another. Thus, the physical stress derived from the non-uniform misfit dislocations are apt to be also highly non-uniform in the silicon epitaxial layer, and this non-uniform stress causes non-uniform benefits for performance with larger variability. Further at those locations where misfit density are high, the defects degrade device performances through shorting device terminals and through other significant leakage mechanisms.

Therefore, there is a need for effective methodology for manufacturing a relaxed SiGe layer.

SUMMARY OF THE INVENTION

In an aspect of the invention, a method is provided for manufacturing semiconductor device. First, a compressively strained SiGe layer is formed on a silicon substrate. Atoms are ion-implanted to form uniformly distributed interstitial dislocation loops in the SiGe layer. Annealing is performed to form uniformly distributed misfit dislocations at the SiGe-silicon interface.

In another aspect of the invention, a method for forming a semiconductor substrate is provided. A SiGe layer is formed on a silicon substrate and the SiGe layer is compressively strained. Atoms are controllably ion-implanted onto the SiGe layer causing univofrmly distributed end-of-range damage therein. Annealing is performed to form interstitial dislocation loops uniformly distributed in the SiGe layer. The uniformly distributed interstitial dislocation loops nucleate uniformly distributed misfit dislocations in the SiGe layer. An expansively strained silicon layer is formed on the SiGe layer.

Yet another aspect of the invention is a semiconductor device having a silicon substrate. A relaxed SiGe layer is formed on the silicon substrate and the SiGe layer includes uniformly distributed misfit dislocations. An expansively strained silicon layer is formed on the relaxed SiGe layer.

BRIEF DESCRIPTION OF THE DRAWINGS

The foregoing and other advantages will be better understood from the following detailed description of a preferred embodiment of the invention with reference to the drawings, in which.

DETAILED DESCRIPTION OF EMBODIMENTS OF THE INVENTION

The invention provides a method that provides an expansively strained silicon layer, which improves performances of the devices formed thereon. The strained silicon layer is formed by epitaxially growing silicon on a relaxed SiGe layer. The relaxed SiGe layer is formed by forming uniformly distributed misfit dislocations in an initially compressively strained SiGe layer formed on a silicon substrate. Nucleation of the misfit dislocations is heavily influenced by interstitial dislocation loops. Thus, in the invention, the interstitial dislocation loops are formed at the desired locations in the SiGe layer with desired densities, in order to control the dislocations and densities of nucleation of the misfit dislocations in the SiGe layer. Thus, the compressively strained SiGe layer is relaxed by nucleation of the misfit dislocations. Since the SiGe layer is relaxed, the silicon layer formed thereon is formed as expansively conforming to the larger lattice constant of the relaxed SiGe layer. As a result, the silicon layer is biaxially tensilely strained, and this increases performances of the devices formed thereon.

Figure 1:
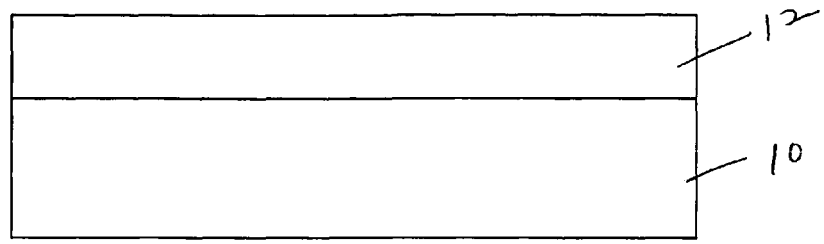
FIGS. 1 to 4 depict sequential phases of the method according to an embodiment of the invention.

FIG. 1 shows a SiGe layer 12 formed on a silicon substrate 10. In an embodiment, the SiGe layer 12 is formed by epitaxially growing at a thickness of approximately 100 Å to 10000 Å. Thus, contrary to conventional art, the invention does not require formation of a thick multi-layered SiGe layer to achieve a relaxed SiGe layer. The silicon substrate 10 has a lattice constant that is less that that of intrinsic unrelaxed SiGe. Thus, when the SiGe layer 12 is epitaxially grown, the SiGe layer 12 is biaxially compressively strained because the underlying silicon layer constrains the epitaxial growth such that the larger lattice structure of the SiGe layer 12 is harmonized with the smaller lattice structure of the silicon substrate 10.

Figure 2:
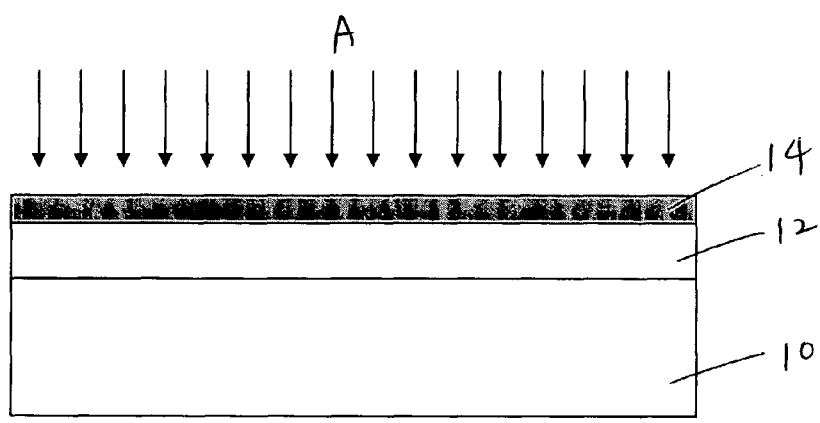

In FIG. 2, atoms are controllably ion-implanted, as shown by arrows "A", onto the SiGe layer 12 at implantation concentration and energy sufficient to amorphize an upper surface portion of the SiGe layer 12. Any neutral amorphization atoms, such as Ge or Si, can be used as the ion-implantation atoms. As the result, an amorphous layer 14 is formed on the upper surface region of the SiGe layer 12. In an embodiment, the amorphous layer 14 is formed to have a thickness of approximately 30 Å to 300 Å, which is approximately one third of the SiGe layer thickness. Noble gases such as He, Ar, etc. could also be used in lieu of Ge or Si, but the dosage has to be high which may lead to other unwanted leakage issues.

During the ion-implantation, the atoms collide with the lattice structure of the SiGe layer 12 and cause amorphization. In an embodiment, for the amorphization, Ge is ion-implanted at an impurity concentration of approximately $3 \times 10^{14}$ atoms/cm$^2$. End-of-range damage to the SiGe layer 12 is formed upon annealing of the amorphized silicon/SiGe material. The end of range damage consists of interstitial loops that coalesce from the damage during annealing. They are relatively stable and have sizes of approximately 100 Å to 500 Å, and have a relatively uniform density.

The end-of-range damage is embedded in the SiGe layer 12 from the interface between the amorphous region 14 and the SiGe layer 12 down towards the interface between the SiGe layer 12 and the silicon substrate 10. The locations of end-of-range damage can be accurately modulated by controlling the ion-implantation concentration and energy. Thus, when the atoms are ion-implanted to form the amorphous layer 14, the implantation concentration and energy are controllably selected such that the end-of-range damage is uniformly distributed in the SiGe layer 12. For example, the atoms are ion-implanted at an implantation concentration of approximately $1 \times 10^{14}$ atoms/cm$^2$ to $1 \times 10^{16}$ atoms/cm$^2$ at implantation energy of approximately 5 KeV to 100 KeV. As will be explained later, the end-of-range damage provides a basis for nucleation of misfit dislocations.

Figure 3:
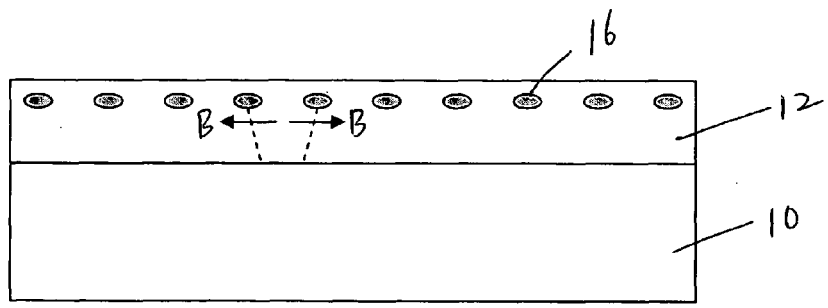

Subsequently, annealing is performed for recrystallization of the amorphous layer 14. In an embodiment, the annealing is performed at a temperature of approximately 500° C. to 1100° C. for approximately 1 second to 30 minutes. Also, the annealing can be performed via spike, rapid thermal or other annealing techniques. As shown in FIG. 3, upon performing annealing, end-of-range interstitial dislocation loops 16 are formed corresponding to the end-of-range damage. In an embodiment, a density of the end-of-range interstitial dislocation loops 16 is approximately $1 \times 10^5$ loops/cm$^2$ to $1 \times 10^{12}$ loops/cm$^2$.

While the SiGe layer 12 is annealed and the amorphous layer 14 is recrystallized, the compressive strain applied to the SiGe layer 12 is relieved and the SiGe layer 12 is relaxed, as shown by arrows "B" in FIG. 3. When the strained SiGe layer 12 is relaxed, the relaxation of the SiGe layer 12 causes misfit dislocations at the interface between the SiGe layer 12 and the silicon substrate 10. Here, when the misfit dislocations are being created, the end-of-range interstitial dislocation loops 16 provide a basis for nucleation of the misfit dislocations. Thus, the misfit dislocations 18 are nucleated under the heavy influence of the end-of-range interstitial dislocation loops 16 that are uniformly distributed at the desired locations and at the desired density.

Figure 4:
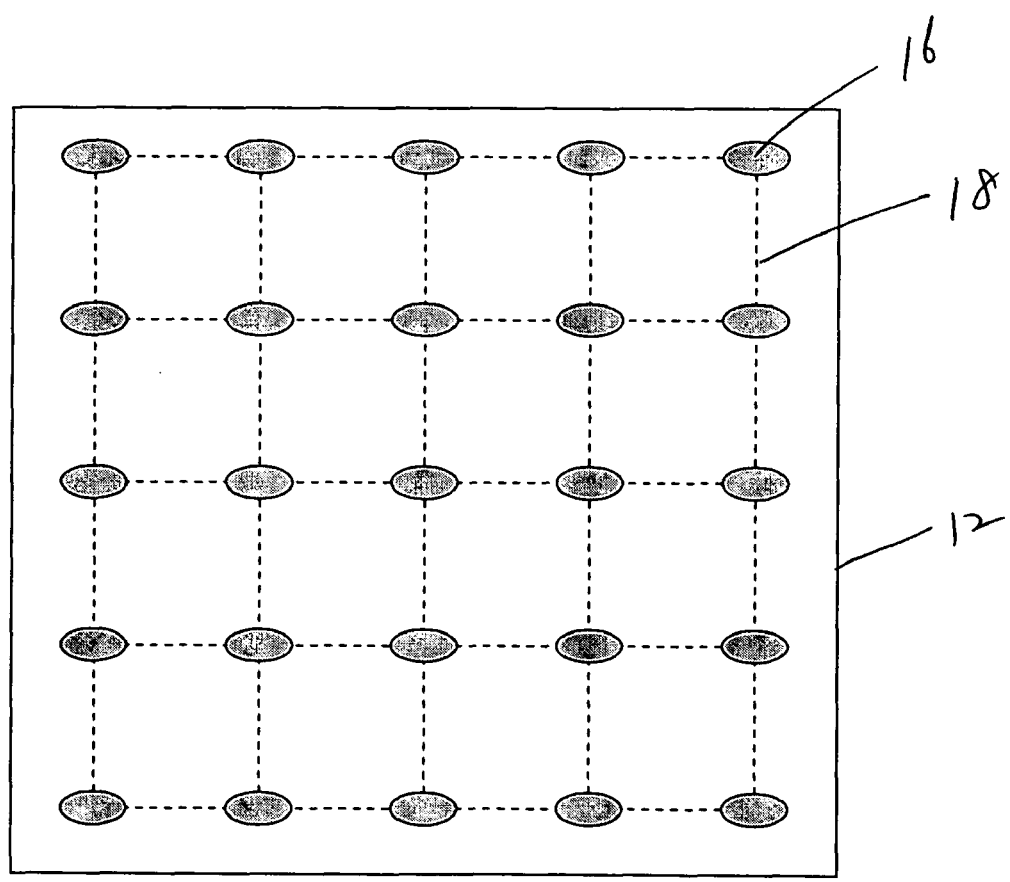

In an embodiment, a density of the misfit dislocations in the SiGe layer is approximately $1 \times 10^5$ #/cm$^2$ to $1 \times 10^{12}$ #/cm$^2$. An example is shown in FIG. 4, in which the misfit dislocations 18 are formed uniformly along the lines connecting two neighboring end-of-range interstitial dislocation loops 16. FIG. 4 further shows the misfit dislocations 18 forming a grid that relaxes the compressive stress uniformly. According to the invention, the relaxation can be increased by creating more misfit dislocations. This is achieved by increasing density of the end-of-range interstitial dislocation loops 16 since nucleation of the misfit dislocations is heavily dictated by the end-of-range interstitial dislocation loops 16.

Figure 5:
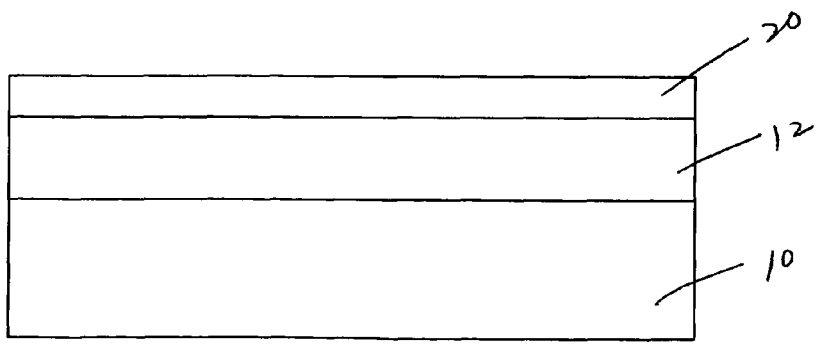
FIG. 5 depicts a side view of a semiconductor device structure shown in FIG. 3 after annealing is performed.

FIG. 5 shows a silicon layer 20 formed on the relaxed SiGe layer 12. In an embodiment, the silicon layer 20 is formed by epitaxially growing on the SiGe layer 12. Since the relaxed SiGe layer 12 has a higher lattice constant than that of silicon, the silicon layer 20 is formed on the SiGe layer 12 as conforming to the higher lattice constant of the relaxed SiGe layer 12. This applies biaxial tensile strain to the silicon layer 20.

Although it is not shown, conventional processing steps are performed to form devices on the biaxially strained silicon tensile layer 20. For example, a gate structure is formed on the silicon layer 20 with a gate oxide therebetween. Source and drain regions are formed in the expansively strained silicon layer 20 by ion-implanting impurity atoms. The tensilely strained silicon layer performs as a substrate and improves device performances.

In the embodiment described above, the atoms are ion-implanted after the SiGe layer 12 is formed on the substrate 10. However, the atoms can be ion-implanted onto the silicon substrate 10 before the SiGe layer 12 is formed. Alternatively, the ion-implantation can be performed after the silicon layer 20 is formed on the SiGe layer 12. In these cases, the degree of the silicon relaxation would still increase the silicon relaxation.

As previously explained so far, according to the invention, the silicon layer 20 is expansively strained due to the relaxation of the underlying SiGe layer 12. The relaxation is caused by forming uniformly distributed misfit dislocations in the compressively strained SiGe layer 12. Since the misfit dislocations are nucleated under the heavy influence of the end-of-range interstitial dislocation loops 16, in the invention, the end-of-range interstitial dislocation loops 16 are formed at the desired locations and at the desired density. The uniform distribution of the interstitial dislocation loops 16 is achieved by controllably ion-implanting atoms so as to form uniformly-distributed end-of-range damage to the SiGe layer. Also, the present invention does not require to form a thick multi-layered SiGe layer to avoid thread dislocations. Accordingly, the invention provides time and cost effective methodology for manufacturing an tensilely strained silicon layer.

While the invention has been described in terms of embodiments, those skilled in the art will recognize that the invention can be practiced with modification within the spirit and scope of the appended claims.

What is claimed is:

1. A semiconductor device comprising:
    a silicon substrate;
    a relaxed SiGe layer formed on the silicon substrate, said SiGe layer including uniformly distributed misfit dislocations at an interface between the silicon substrate and the relaxed SiGe layer; and
    a tensilely strained silicon layer formed on the relaxed SiGe layer.

2. The semiconductor device of claim 1, wherein the density of the misfit dislocations in the SiGe layer is approximately $1\times10^5$ loops/cm$^2$ to $1\times10^{12}$ loops/cm$^2$.

3. The semiconductor device of claim 1, wherein the misfit dislocations are arranged in a shape of grid when viewed from above.

4. The semiconductor device of claim 1, wherein the SiGe layer is formed at a thickness of approximately 100 Å to 10000 Å.

5. The semiconductor device of claim 1, wherein the density of misfit dislocations in the SiGe layer, measured at an interface between the silicon substrate and the SiGe layer, is approximately $1\times10^5$ loops/cm$^2$ to $1\times10^{12}$ loops/cm$^2$.

6. The semiconductor device of claim 5, wherein the density of misfit dislocations in the SiGe layer is approximately $1\times10^5$ loops/cm$^2$ to $1\times10^{12}$ loops/cm$^2$.

* * * * *